(12) United States Patent
Moriya et al.

(10) Patent No.: US 8,063,722 B2
(45) Date of Patent: Nov. 22, 2011

(54) BALANCE FILTER COMPRISING TWO ACOUSTIC WAVE FILTERS CONNECTED TO A SINGLE GROUND TERMINAL

(75) Inventors: Akira Moriya, Yokohama (JP); Yasufumi Kaneda, Yokohama (JP); Osamu Kawachi, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 339 days.

(21) Appl. No.: 12/392,622

(22) Filed: Feb. 25, 2009

(65) Prior Publication Data

US 2009/0261921 A1 Oct. 22, 2009

(30) Foreign Application Priority Data

Feb. 27, 2008 (JP) .................. 2008-045583

(51) Int. Cl.
 *H03H 9/64* (2006.01)
(52) U.S. Cl. ............ 333/193; 333/195; 310/313 B
(58) Field of Classification Search .......... 333/193, 333/195; 310/313 B
 See application file for complete search history.

(56) References Cited

U.S. PATENT DOCUMENTS

| | | | |
|---|---|---|---|
| 6,985,048 B2* | 1/2006 | Takamine et al. | 333/133 |
| 7,898,366 B2* | 3/2011 | Yasuda | 333/195 |
| 2002/0167378 A1* | 11/2002 | Sawada | 333/193 |
| 2003/0085778 A1 | 5/2003 | Yata et al. | |
| 2003/0137365 A1* | 7/2003 | Takamine | 333/133 |
| 2003/0146805 A1* | 8/2003 | Sawada | 333/133 |
| 2003/0160665 A1 | 8/2003 | Hagn et al. | |
| 2004/0196119 A1 | 10/2004 | Shibahara et al. | |
| 2007/0103254 A1 | 5/2007 | Haruta et al. | |

FOREIGN PATENT DOCUMENTS

| | | |
|---|---|---|
| JP | 2003-124777 A | 4/2003 |
| JP | 2003-528523 A | 9/2003 |
| JP | 2004-260402 A | 9/2004 |
| JP | 2004-282707 A | 10/2004 |
| JP | 2008-028824 A | 2/2008 |
| WO | WO 2006/003787 A1 | 1/2006 |
| WO | WO 2008/142905 A1 * | 11/2008 |

* cited by examiner

*Primary Examiner* — Barbara Summons

(74) *Attorney, Agent, or Firm* — Arent Fox LLP

(57) ABSTRACT

A balance filter includes two acoustic wave filters connected between a single unbalanced terminal and two balanced terminals, and a ground terminal connected to the two acoustic wave filters via a first interconnection portion and a second interconnection portion. The first interconnection portion is connected to the two acoustic wave filters, and the second interconnection portion is connected to the first interconnection portion in a region that is located between the two acoustic wave filters and extends in a direction orthogonal to a direction in which the two acoustic wave filters are aligned.

9 Claims, 11 Drawing Sheets

*1: 1ST EMBODIMENT
*2: 2ND COMPARATIVE EXAMPLE

*1: 1ST EMBODIMENT
*2: 2ND COMPARATIVE EXAMPLE

*1: 1ST EMBODIMENT
*2: 2ND COMPARATIVE EXAMPLE

*1: 1ST EMBODIMENT
*2: 2ND COMPARATIVE EXAMPLE

*1: 1ST EMBODIMENT
*2: 2ND COMPARATIVE EXAMPLE

*1: 1ST EMBODIMENT
*2: 2ND COMPARATIVE EXAMPLE

US 8,063,722 B2

BALANCE FILTER COMPRISING TWO ACOUSTIC WAVE FILTERS CONNECTED TO A SINGLE GROUND TERMINAL

CROSS-REFERENCE TO RELATED APPLICATION

This application is based upon and claims the benefit of priority of the prior Japanese Patent Application No. 2008-045583, filed on Feb. 27, 2008, the entire contents of which are incorporated herein by reference.

FIELD

The present invention relates to a balance filter having an unbalance-balance conversion function.

BACKGROUND

Recently, compact and light surface acoustic wave (SAW) filters have been used as filters in mobile communication devices in terms of downsizing, weight saving and frequency raising. It is now required to reduce the number of parts to achieve further improvements in downsizing and weight saving of the mobile communication devices and to realize a SAW filter having a new function. For example, a balance filter having an unbalance-balance conversion function (balun function) has been proposed. Balanced signals use a pair of signal lines and define data by the potential difference between the signal lines. The signals on the signal lines have an identical amplitude and a 180-degree phase difference. An unbalanced signal defines data by the potential of a single signal line to the ground potential.

Balance filters having the unbalance-balance conversion function are described in Japanese Laid-Open Patent Publication Nos. 2003-528523 (Document 1) and 2003-124777 (Document 2). The balance filter described in Document 1 has a plurality of ground terminals. The balance filter described in Document 2 has six electrode pads on a package. Thus, there is a difficulty in further downsizing of the balance filters. If only one ground terminal is used, the degree of balance will be degraded and the bandpass characteristic will be deteriorated.

SUMMARY

The present invention has been made in view of the above circumstances and provides a downsized SAW filter without degrading the degree of balance and deteriorating the bandpass characteristic.

According to an aspect of the present invention, there is provided a balance filter including: two acoustic wave filters connected between a single unbalanced terminal and two balanced terminals; and a ground terminal connected to the two acoustic wave filters via a first interconnection portion and a second interconnection portion, the first interconnection portion connected to the two acoustic wave filters, and the second interconnection portion connected to the first interconnection portion in a region that is located between the two acoustic wave filters and extends in a direction orthogonal to a direction in which the two acoustic wave filters are aligned.

DESCRIPTION OF EMBODIMENTS

First, a description will be given of a balance filter in accordance with a first comparative example.

Figure 1:
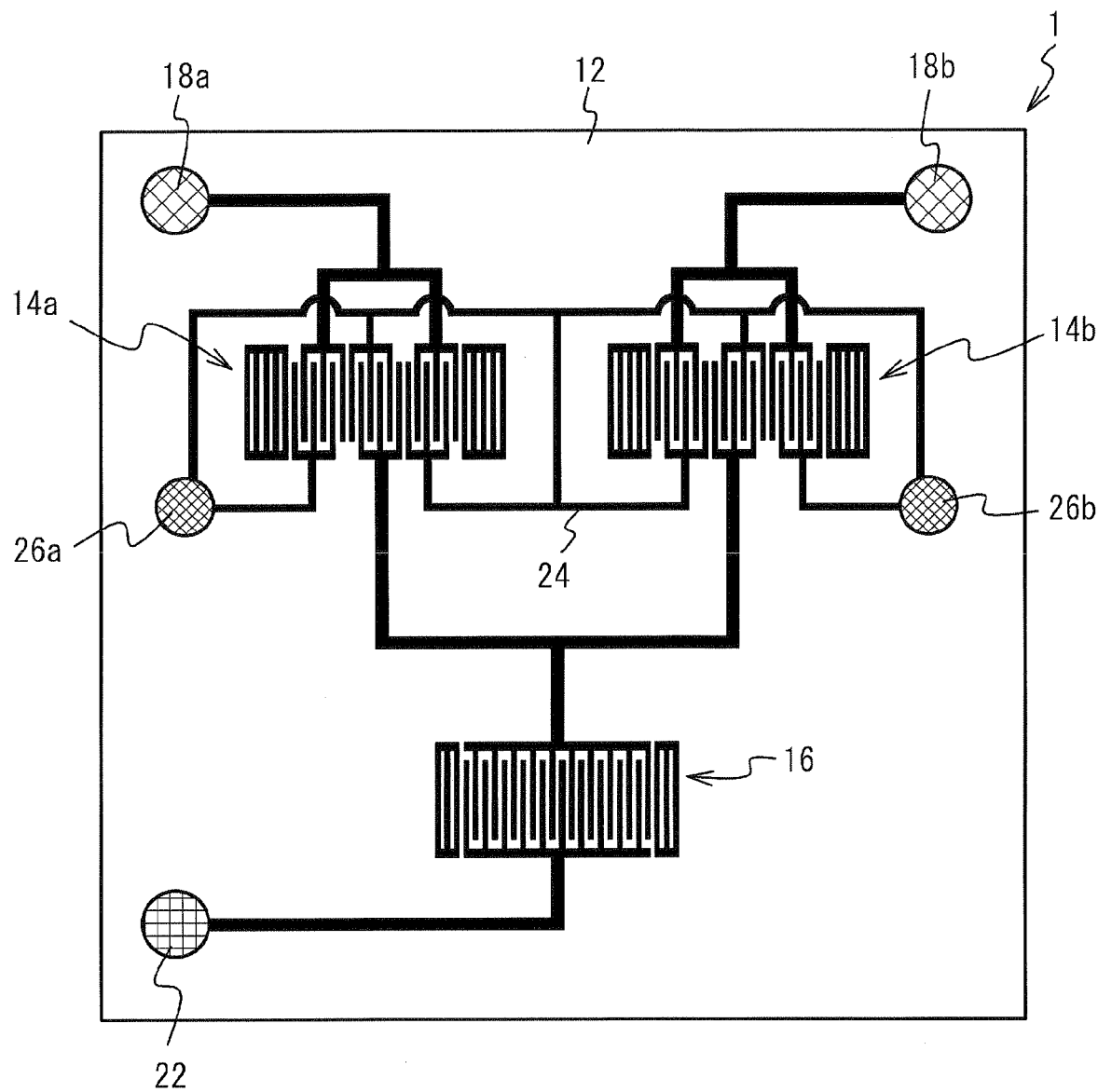
FIG. 1 is a schematic plan view of a balance filter in accordance with a first comparative example.

FIG. 1 is a schematic plan view of a balance filter in accordance with the first comparative example. It should be noted that only a small number of electrode fingers of comb electrodes are illustrated for IDTs (interdigital transducers) and reflection electrodes used in first and second comparative examples and first through fifth embodiments mentioned hereinafter for the sake of simplicity although a large number of electrode fingers are actually used. Referring to FIG. 1, a balance filter 1 of the first comparative example has two SAW filters 14a and 14b and a first SAW resonator 16, which is connected in series to the SAW filters 14a and 14b. The SAW filters 14a and 14b and the first SAW resonator 16 are composed of IDTs and reflection electrodes, which are formed on a piezoelectric substrate 12. Balanced output terminals 18a and 18b are respectively connected to the SAW filters 14a and 14b. An unbalanced input terminal 22 is connected to the first SAW resonator 16.

A first interconnection portion 24 is connected to both the SAW filters 14a and 14b. Two ground terminals 26a and 26b are connected to the first interconnection portion 24, and the corresponding comb electrodes of the IDTs of the SAW filters 14a and 14b are grounded.

The first comparative example employs the two ground terminals 26a and 26b, as illustrated in FIG. 1. As an increased number of ground terminals is used, a greater area for the ground terminals is occupied on the piezoelectric substrate 12. This prevents the balance filter 1 from being downsized. The following embodiments are directed to downsizing without degrading the degree of balance and deteriorating the bandpass characteristic.

First Embodiment

Figure 2:
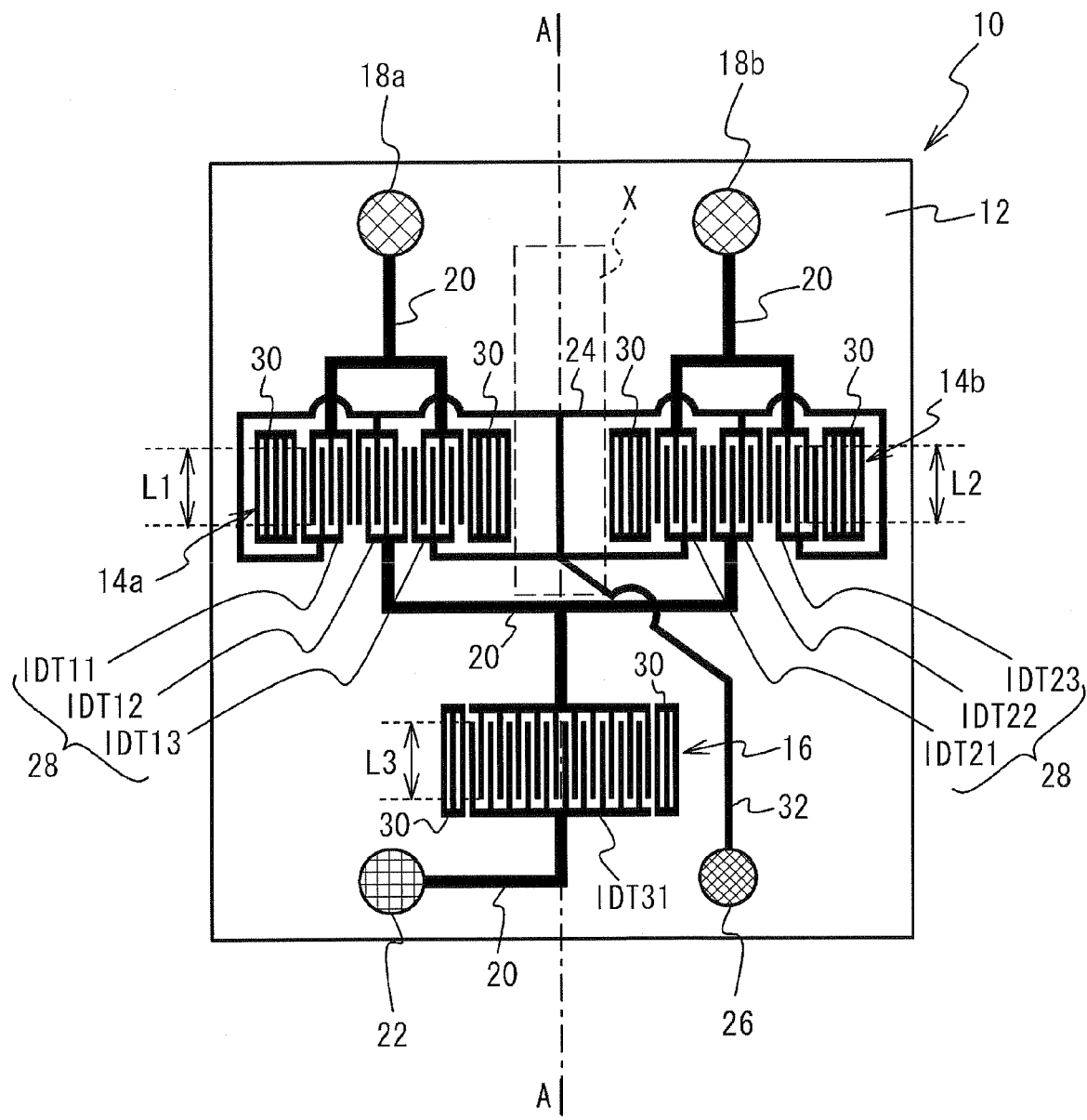
FIG. 2 is a schematic plan view of a balance filter in accordance with a first embodiment.

FIG. 2 is a schematic plan view of a balance filter in accordance with a first embodiment of the present invention. Referring to FIG. 2, a balance filter 10 of the first embodiment includes the two SAW filters 14a and 14b and the first SAW resonator 16, which is connected in series to the SAW filters 14a and 14b. Each of the two SAW filters 14a and 14b is a double-mode SAW filter. The SAW filters 14a and 14b and the first SAW resonator 16 include a group 28 of IDTs and reflection electrodes 30, which are formed on the piezoelectric substrate 12 made of, for example, lithium tantalate (LiTaO$_3$). The group 28 of IDTs and reflection electrodes 30 may be made of, for example, aluminum. Balanced output terminals 18a and 18b are respectively connected to the SAW filters 14a and 14b via third interconnection portions 20. An unbalanced input terminal 22 is connected to the first SAW resonator 16 via another third interconnection portion 20.

In the SAW filter 14a, three IDTs of IDT11, IDT12 and IDT13 are formed between a pair of reflection electrodes 30. One of the comb electrodes of IDT11 and one of the comb electrodes of IDT13 are connected to the balanced output terminal 18a, and the other comb electrodes are connected to the first interconnection portion 24. One of the comb electrodes of IDT12 is connected to the first SAW resonator 16, and the other is connected to the first interconnection portion 24. Similarly, in the SAW filter 14b, three IDTs of IDT21, IDT22 and IDT23 are formed between a pair of reflection electrodes 30. One of the comb electrodes of the IDT21 and one of the comb electrodes of IDT23 are connected to the balanced output terminal 18b, and the other electrodes are connected to the first interconnection portion 24. One of the comb electrodes of IDT22 is connected to the first SAW resonator 16 via the third interconnection portion 20, and the other is connected to the first interconnection portion 24. That is, the first interconnection portion 24 is connected to both the SAW filters 14a and 14b.

The first interconnection portion 24 is connected to a second interconnection portion 32 in a region X, which is located between the SAW filters 14a and 14b and extends in a direction orthogonal to the direction in which the SAW filters 14a and 14b are aligned. A single ground terminal 26 is connected to the second interconnection portion 32. That is, the ground terminal 26 is coupled to both the SAW filters 14a and 14b via the first interconnection portion 24 and the second interconnection portion 32. Thus, one of the comb electrodes of each of IDT11, IDT12 and IDT13 is grounded. Similarly, one of the comb electrodes of each of IDT21, IDT22 and IDT23 is grounded. The interconnection portion 24 has a pattern that is symmetrical about a center line A-A between the SAW filters 14a and 14b. Further, the balanced output terminals 18a and 18b are symmetrical with each other about the center line A-A.

In the first SAW resonator 16, a single IDT31 is provided between the two reflection electrodes 30. One of the comb electrodes of IDT31 is connected to the SAW filters 14a and 14b, and the other electrode is connected to the unbalanced input terminal 22.

Next, a description will be given of the structures of the SAW filters 14a and 14b and the first SAW resonator 16. In the following, the number of pairs of electrode fingers is defined so that one pair consists of one finger of one of two comb electrodes of one IDT and one finger of the other comb electrode of the IDT, these electrode fingers being adjacent to each other and interleaved. An aperture length is the length of a section in which two adjacent, interleaved electrode fingers laterally overlap with each other. In FIG. 2, the SAW filter 14a has an aperture length L1 of 85 μm, and IDT11, IDT12 and IDT13 have 12.5, 24 and 12.5 pairs of electrode fingers, respectively. The SAW filter 14b is configured like the SAW filter 14a. That is, the SAW filter 14b has an aperture length L2 of 85 μm, and IDT21, IDT22 and IDT23 have 12.5, 24 and 12.5 pairs of electrode fingers, respectively. The first SAW resonator 16 has an aperture length L3 of 50 μm and 120 pairs of electrode fingers.

Figure 3:
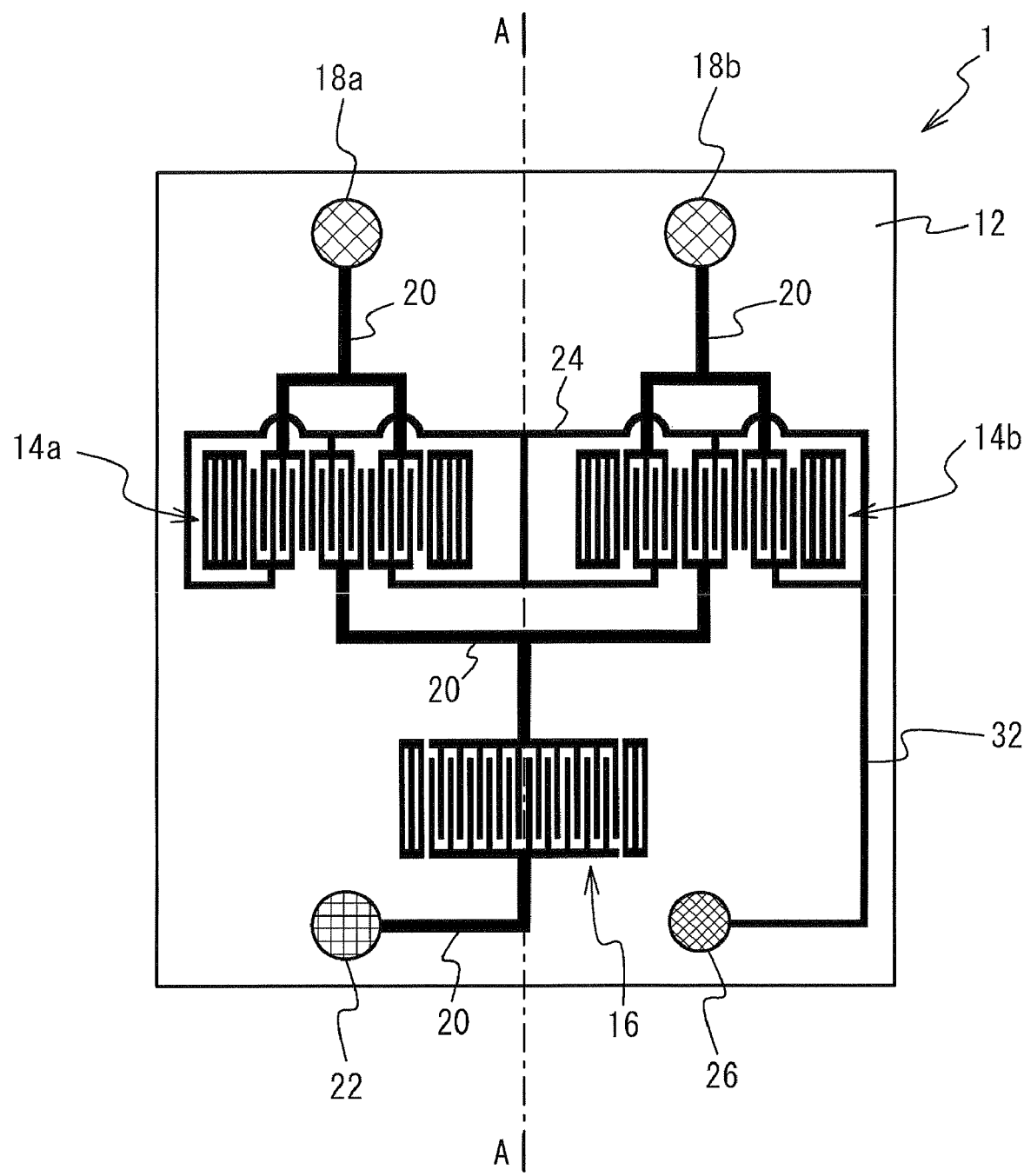
FIG. 3 is a schematic plan view of a balance filter in accordance with a second comparative example.

FIG. 3 is a schematic plan view of a balance filter in accordance with a second comparative example. Referring to FIG. 3, the balance filter 1 of the second comparative example, the first interconnection portion 24 and the second interconnection portion 32 are connected on the side of the SAW filter 14b. In other words, the first interconnection portion 24 and the second interconnection portion 32 are connected on a far side of the SAW filter 14b with respect to the SAW filter 14a.

Figure 4A:
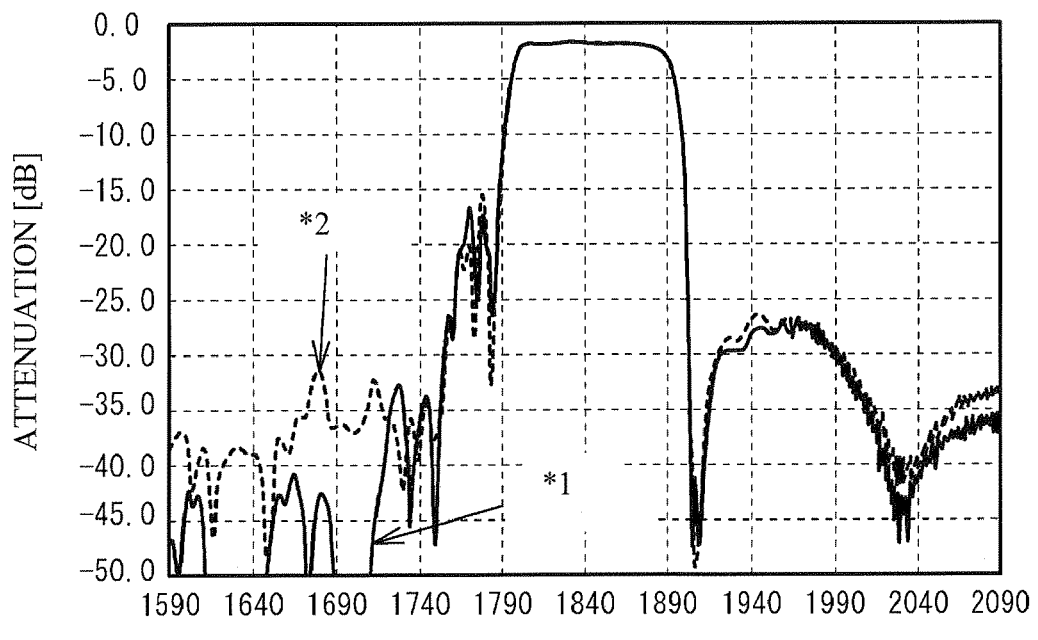
FIGS. 4A and 4B depict bandpass characteristics of the first embodiment and the second comparative example.
Figure 4B:
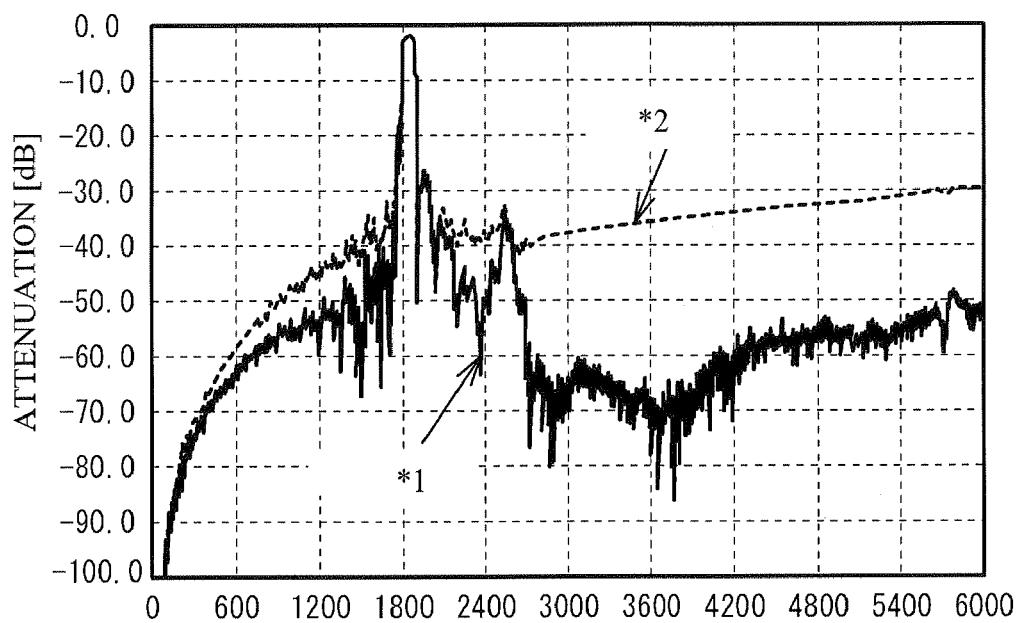

FIGS. 4A and 4B are frequency characteristics of the balance filters of the first embodiment and the second comparative example. More particularly, FIG. 4A shows frequency characteristics in the pass bands and vicinities thereof, and FIG. 4B shows frequency characteristics in a wider range. The horizontal axis in each of the graphs denotes the frequency [MHz], and the vertical axis denotes attenuation [dB]. Solid lines in FIGS. 4A and 4B indicate measurement results for the balance filter of the first embodiment, and broken lines indicate measurement results for the balance filter of the second comparative example. FIG. 4A describes that the first embodiment and the second comparative example have approximately equal insertion losses in the pass bands. FIG. 4B describes that the first embodiment has greater attenuations than those of the second comparative example at frequencies other than those of the pass band. Particularly, the first embodiment has considerably great attenuations at frequencies higher than those of the pass band, as compared to the second comparative example.

Figure 5A:
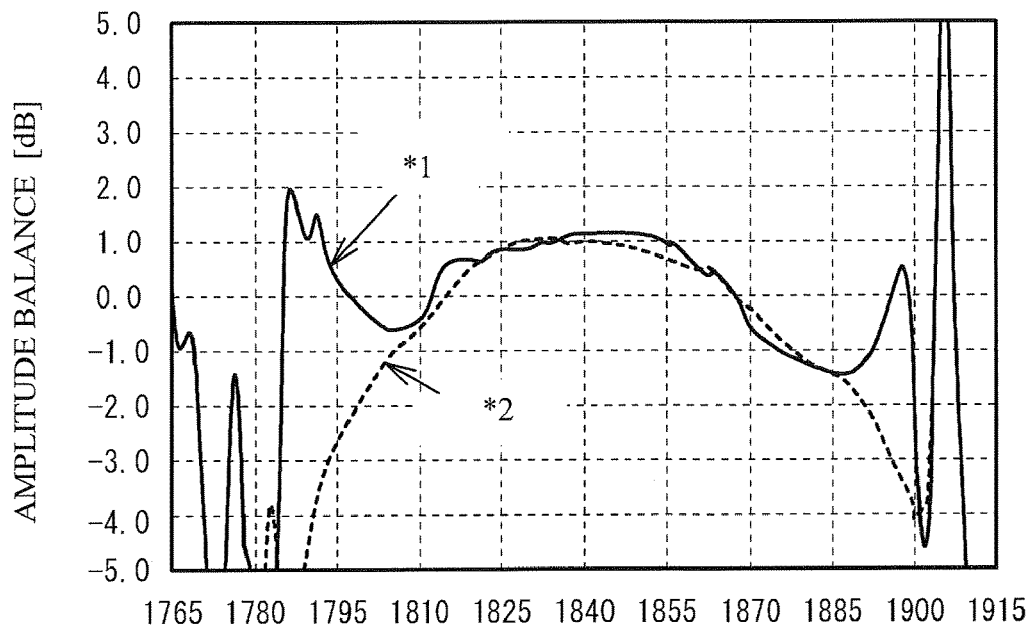
FIGS. 5A and 5B depict amplitude balances of the first embodiment and the second comparative example with regard to frequency.
Figure 5B:
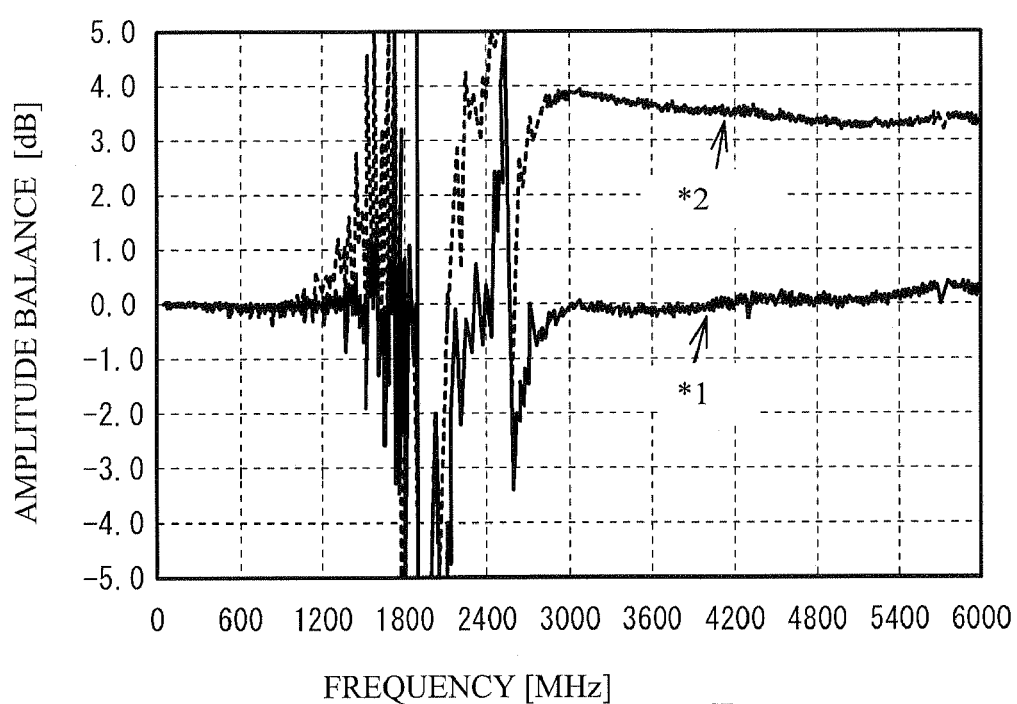

FIGS. 5A and 5B show amplitude balance versus frequency characteristics of the first embodiment and the second comparative example. More particularly, FIG. 5A shows amplitude balance versus frequency characteristics in the pass bands and vicinities thereof, and FIG. 5B shows these characteristics in a wider range. The horizontal axis in each of the graphs denotes the frequency [MHz], and the vertical axis denotes amplitude balance [dB]. When the amplitude balance is equal to 0 [dB], the outputs at the balanced output terminals 18a and 18b have an identical amplitude. FIG. 5A shows that the first embodiment (described by a solid line) and the second comparative example (described by a broken line) do not have great difference in the pass bands. FIG. 5B shows that the first embodiment has greatly improved amplitude balance at frequencies higher than those of the pass bands, as compared to the second comparative example.

Figure 6A:
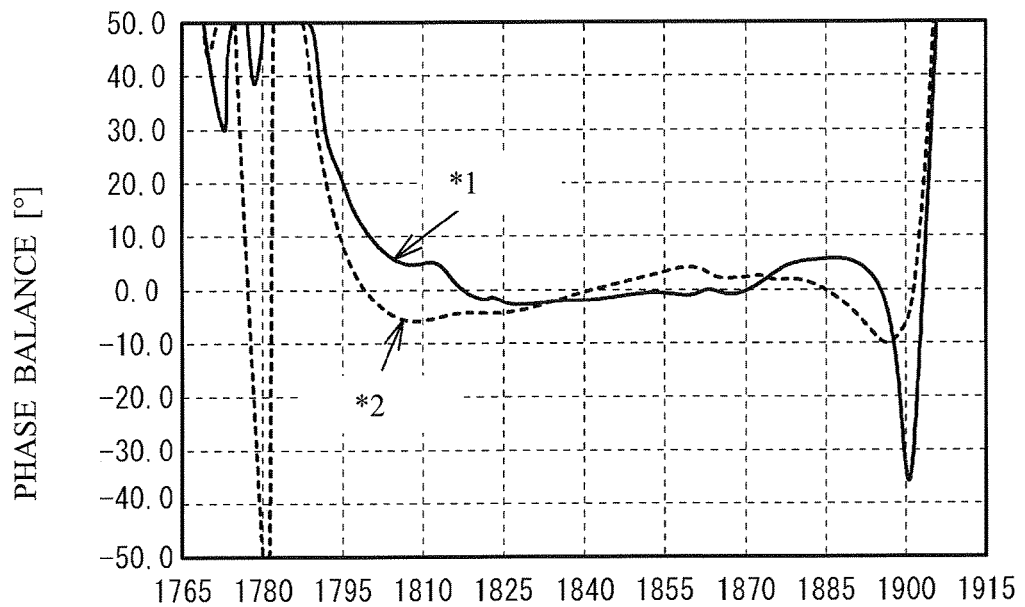
FIGS. 6A and 6B depict phase balances of the first embodiment and the second comparative example with regard to frequency.
Figure 6B:
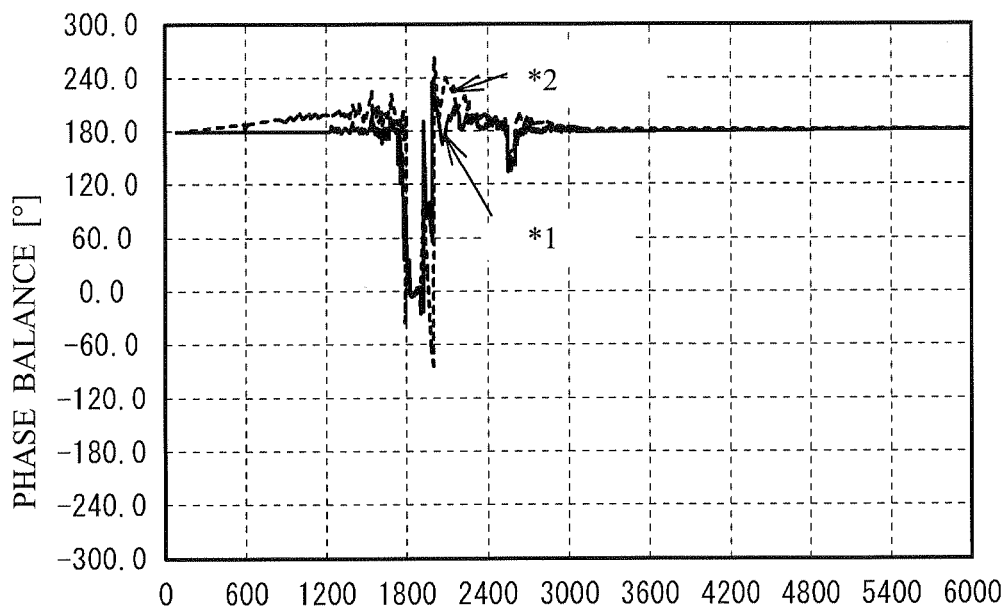

FIGS. 6A and 6B show phase balance versus frequency characteristics of the first embodiment and the second comparative example. More particularly, FIG. 6A shows phase balance versus frequency characteristics in the pass bands and vicinities thereof, and FIG. 6B shows these characteristics in a wider range. The horizontal axis in each of the graphs denotes the frequency [MHz], and the vertical axis denotes phase balance [°]. When the phase balance is equal to 0[°], the outputs at the balanced output terminals 18a and 18b are 180° out of phase. FIG. 6A shows that the first embodiment (described by a solid line) and the second comparative example (described by a broken line) are approximately 180° out of phase in the pass bands (the phase balance is 0[°]). FIG. 6B shows that the first embodiment is closer to the in-phase state (the phase balance is 180[°]) at frequencies higher than those of the pass bands, as compared to the second comparative example.

As illustrated in FIG. 3, the balance filter of the second comparative example is configured so that the first interconnection portion 24 and the second interconnection portion 32 are connected on the side of the SAW filter 14b. Thus, the distance between the ground terminal 26 and the SAW filter 14a differs from that between the ground terminal 26 and the SAW filter 14b.

In contrast, as illustrated in FIG. 2, the balance filter of the first embodiment is configured so that the two SAW filters 14a and 14b are respectively arranged between the single unbalanced input terminal 22 and the balanced output terminal 18a and between the single unbalanced input terminal 22 and the balanced output terminal 18b. The single ground terminal 26 is connected to both the SAW filters 14a and 14b via the first interconnection portion 24 and the second interconnection portion 32. The first interconnection portion 24 is connected to both the SAW filters 14a and 14b, and the second interconnection portion 32 is connected to the first interconnection portion 24 in the region X that is interposed between the SAW filters 14a and 14b and extends in the direction orthogonal to the direction in which the SAW filters 14a and 14b are aligned. With this arrangement, it is possible to equalize the distance between the ground terminal 26 and the SAW filter 14a and the distance between the ground terminal 26 and the SAW filter 14b. The equalized distances realize equal parasitic capacitances and equal parasitic inductances coupled to the balanced output terminals 18a and 18b. Thus, as illustrated in FIGS. 4A through 6B, the first embodiment is capable of improving the amplitude balance and the phase balance with regard to the frequency and improving the bandpass characteristic, as compared to the second comparative example. Particularly, increased attenuation resulting from the amplitude balance with respect to the frequency can be realized at frequencies outside of the pass band.

As illustrated in FIG. 2, the first interconnection portion 24 is symmetrical about the center line A-A between the SAW filters 14a and 14b. The symmetrical arrangement of the first interconnection portion 24 realizes identical parasitic capacitances and identical parasitic inductances coupled to the balanced output terminals 18a and 18b. It is thus possible to further improve the amplitude balance and the phase balance with regard to the frequency and to improve the bandpass characteristic. Particularly, increased attenuation resulting from the amplitude balance with respect to the frequency can be realized at frequencies outside of the pass band.

As illustrated in FIG. 2, the balanced output terminals 18a and 18b are symmetrically arranged about the center line A-A between the SAW filters 14a and 14b. This symmetrical arrangement realizes identical parasitic capacitances and identical parasitic inductances coupled to the balanced output terminals 18a and 18b. It is thus possible to further improve the amplitude balance and the phase balance with regard to the frequency and to improve the bandpass characteristic. Particularly, increased attenuation resulting from the amplitude balance with respect to the frequency can be realized at frequencies outside of the pass band.

As illustrated in FIG. 2, the first SAW resonator 16 is arranged between the SAW filters 14a and 14b and the unbalanced input terminal 22 and is connected in series to the SAW filters 14a and 14b. In this arrangement, when the anti-resonance frequency of the first SAW resonator 16 is set at a frequency close to the pass band and outside thereof, the attenuation pole can be caused close to and outside of the pass band. It is thus possible to increase the attenuation outside of the pass band without increasing the insertion loss.

As illustrated in FIG. 2, the balance filter of the first embodiment is equipped with the two balanced output terminals 18a and 18b, the single unbalanced input terminal 22 and the single ground terminal 26. That is, the present balance filter has four external terminals. In contrast, the balance filter of the first comparative example has the two balanced output terminals 18a and 18b, the single unbalanced input terminal 22 and the two ground terminals 26a and 26b. That is, the first comparative example has five external terminals. The first embodiment has a reduced number of external terminals and needs a reduced region occupied for the external terminals. Thus, according to the first embodiment, it is possible to realize the balance filter smaller than that of the first comparative example.

In the first embodiment, the two SAW filters 14a and 14b are respectively double-mode SAW filters. Thus, as illustrated in FIG. 2, the third interconnection portions 20 that are located on the input side and are connected to the SAW filters 14a and 14b and the third interconnection portion 20 that is located on the output side and are connected to the SAW filters 14a and 14b are respectively arranged on both sides of the SAW filters 14a and 14b so as to interpose the SAW propagation. In other words, the first interconnection portion 24 has portions connected to the SAW filters 14a and 14b on both sides of the SAW propagation. Thus, it is preferable that the first interconnection portion 24 is connected to both the SAW filters 14a and 14b on both sides of the SAW filters 14a and 14b, which correspond to both sides of SAW propagation, and are connected to each other between the SAW filters 14a and 14b. With this arrangement, the SAW filters 14a and 14b can be grounded more reliably. As has been described, it is preferable that the first interconnection portion 24 has a symmetrical arrangement about the center line A-A. That is, preferably, the interconnection portion 24 has a portion that runs on the line A-A. It is also preferable that the first interconnection portion 24 is arranged so as to surround the SAW filters 14a and 14b as much as possible.

Figure 7:
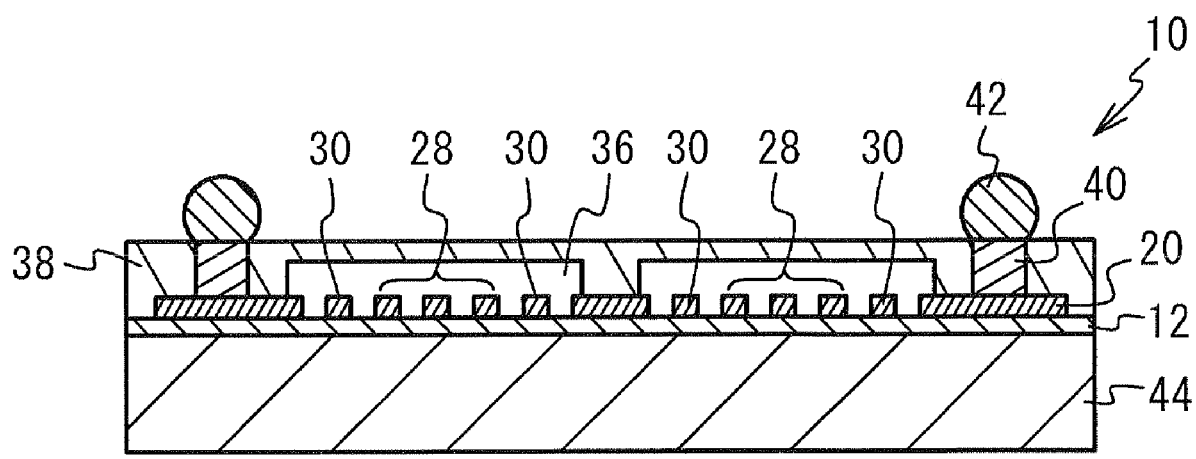
FIG. 7 is a schematic cross-sectional view of a balance filter having a WLP structure.

The balance filter of the first embodiment may have a wafer level package (WLP) structure, as illustrated in FIG. 7, which depicts a cross section taken along a line that runs the group 28 of IDTs and the external terminals. Referring to FIG. 7, the balance filter 10 has a WLP structure having the piezoelectric substrate 12 having a main surface on which the group 28 of IDTs, the reflection electrodes 30, the third interconnection portions 20, the first interconnection portions (not illustrated) and second interconnection portions (not illustrated) are formed. A resin portion 38, which may be made of for example, epoxy resin, is provided on the main surface of the piezoelectric substrate 12 so as to form cavities 36 respectively located above the group 28 of IDTs. Column electrodes 40, which made be made of, for example, copper, are formed on the third interconnection portions 20 so as to penetrate the resin portion 38. Solder bumps 42 are provided on the column electrodes 40. The combinations of the column electrodes 40 and the solder bumps 42 function as external terminals for connecting the group 28 of IDTs to an external circuit in flip-chip mounting of the balance filter 10. These external terminals correspond to the balanced output terminals 18a and 18b, the unbalanced input terminal 22 and the ground terminal 26. An insulating film 44, which may be made of, for example, alumina ($Al_2O_3$), is provided on the back surface of the piezoelectric substrate 12. The temperature characteristic of the balance filter 10 can be improved by attaching the insulating film 44 to the back surface of the piezoelectric substrate 12 in which the insulating film 44 has a thickness greater than that of the piezoelectric substrate 12 and has a linear thermal expansion coefficient smaller than that of the piezoelectric substrate 12 in the direction of SAW propagation.

The present invention is not limited to the structure of the first embodiment illustrated in FIG. 2 in which the first interconnection portion 24 and the second interconnection portion 38 cross the third interconnection portions 20 above the third interconnection portion 30. The third interconnection portions 20 may cross the first interconnection portion 24 and the second interconnection portion 32 above the first interconnection portion 24 and the second interconnection portion 32. An insulating member may be interposed between the first interconnection portion 24 and the third interconnection portions 20 and between the second interconnection portion 32 and the third interconnection portions 20 in order to prevent the interconnection portions 24 and 20 from being electrically connected together and to prevent the interconnection portions 32 and 20 from being electrically connected together.

As illustrated in FIG. 7, the balance filter 10 of the WLP structure has the solder bumps 42 provided above the piezoelectric substrate 12 and used for flip-chip mounting. Thus, the balance filter 10 may be mounted on a base substrate by flip-chip mounting, so that downsizing can be achieved even after mounting.

Second Embodiment

Figure 8:
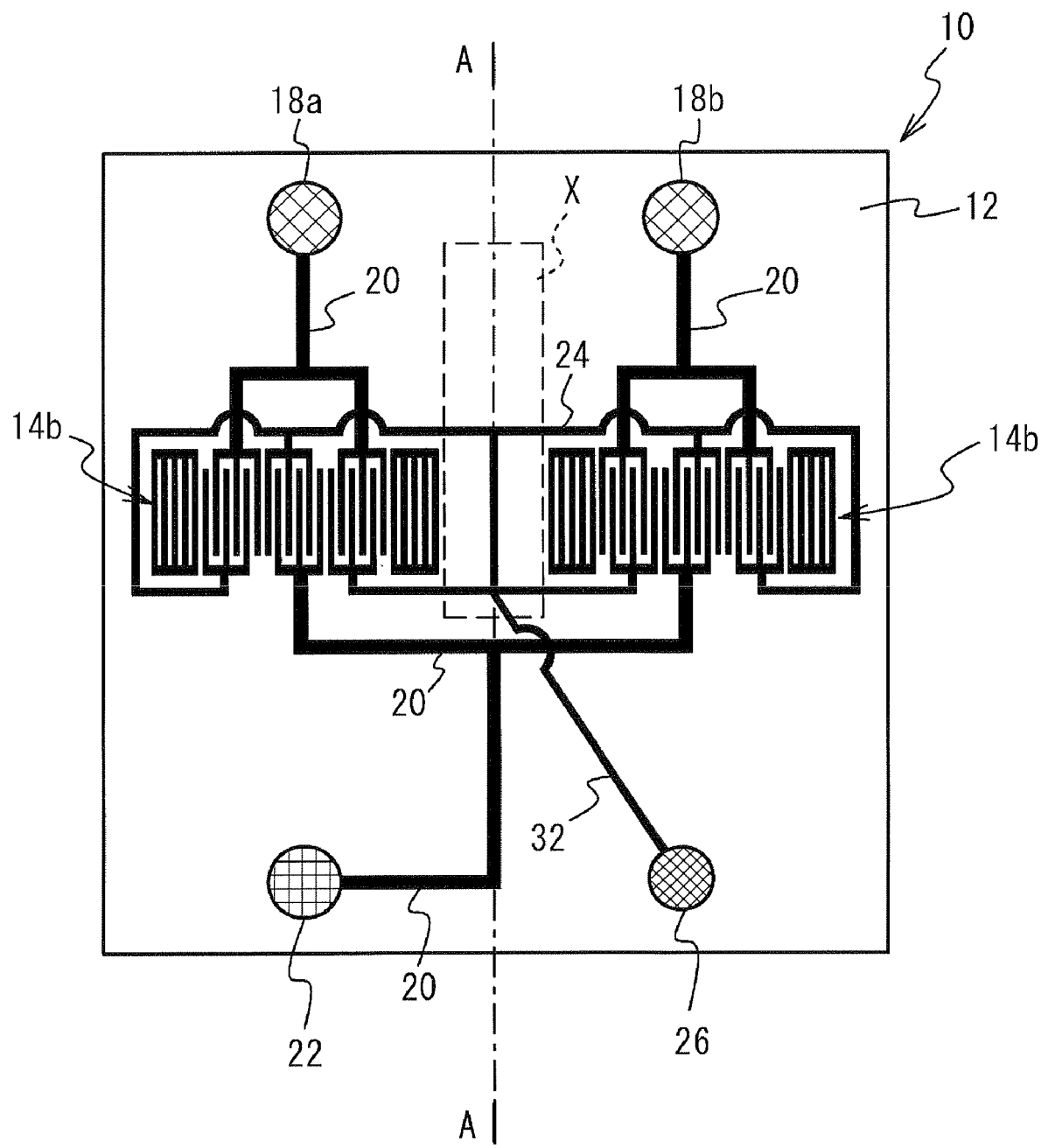
FIG. 8 is a schematic plan view of a balance filter in accordance with a second embodiment.

FIG. 8 is a schematic plan view of a balance filter in accordance with a second embodiment of the present invention. Referring to FIG. 8, the first SAW resonator 16 is not provided between the SAW filters 14a and 14b and the unbalanced input terminal 22. The other structures of the balance filter depicted in FIG. 8 are the same as those depicted in FIG. 2.

As illustrated in FIG. 8, the second embodiment has an arrangement similar to that of the first embodiment in terms of the region X. More particularly, the second embodiment has the region X that is located between the SAW filters 14a and 14b and extends in the direction orthogonal to the direction in which the SAW filters 14a and 14b are aligned. The first interconnection portion 24 and the second interconnection portion 32 are connected together in the region X. Thus, even when the first SAW resonator 16 is not provided between the SAW filters 14a and 14b and the unbalanced input terminal 22, the second embodiment is capable of equalizing the parasitic capacitances and the parasitic inductances coupled to the balanced output terminals 18a and 18b and improving the amplitude balance and the phase balance that depend on the frequency and the bandpass characteristic. Particularly, increased attenuation resulting from the amplitude balance with respect to the frequency can be realized at frequencies outside of the pass band.

The balance filter of the second embodiment has only one ground terminal 26, so that downsizing of the balance filter can be realized.

Third Embodiment

Figure 9:
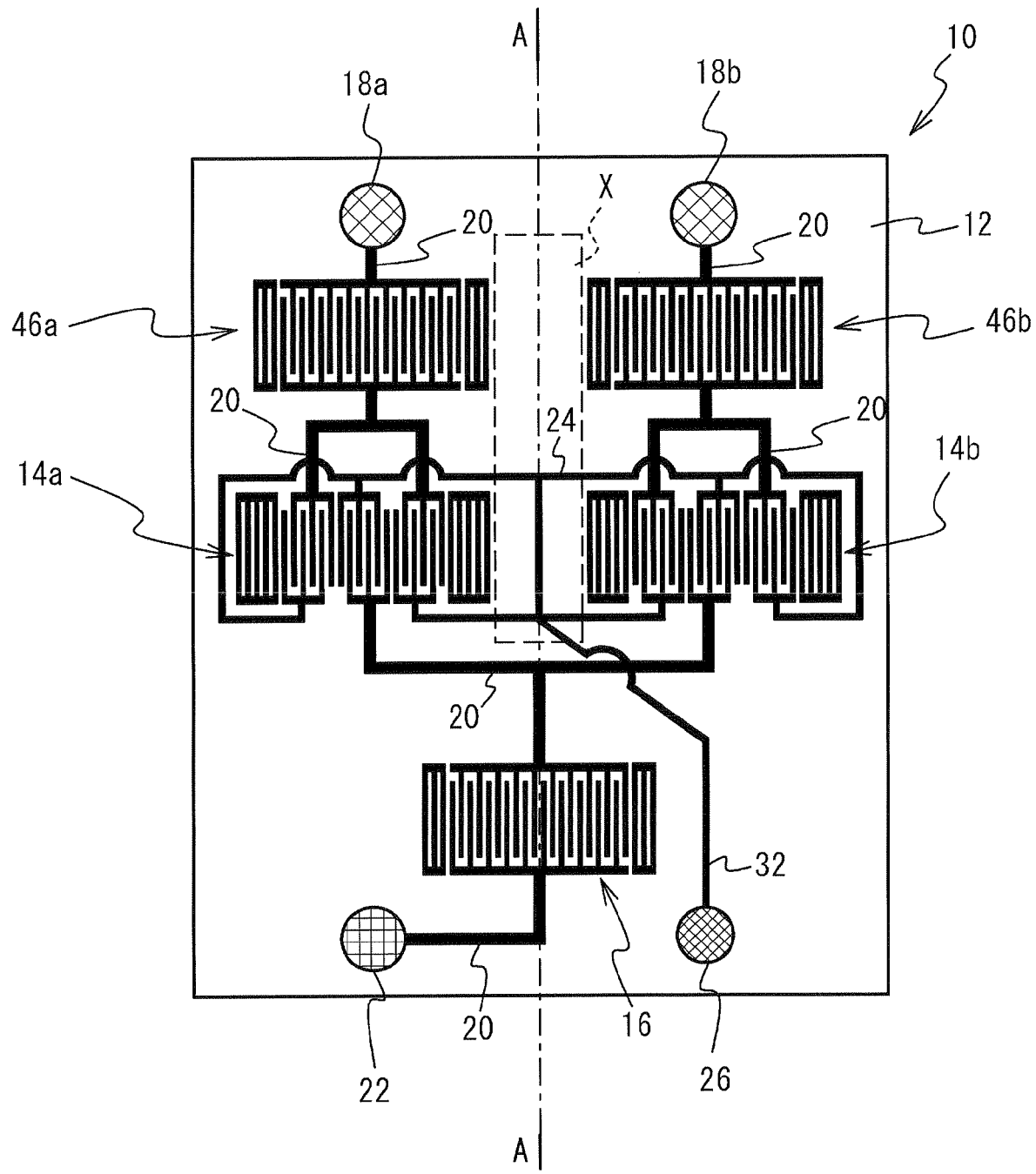
FIG. 9 is a schematic plan view of a balance filter in accordance with a third embodiment.

FIG. 9 is a schematic plan view of a balance filter in accordance with a third embodiment of the present invention. Referring to FIG. 9, a second SAW resonator 46a is located between the SAW filter 14a and the balanced output terminal 18a and is connected in series to the SAW filter 14a. Similarly, another second SAW resonator 46b is located between the SAW filter 14b and the balanced output terminal 18b and is connected in series to the SAW filter 14b. The other structures of the third embodiment are the same as those of the first embodiment illustrated in FIG. 2.

As depicted in FIG. 9, the first interconnection portion 24 and the second interconnection portion 32 are connected to each other in the region X that is located between the SAW filters 14a and 14b and extends in the direction orthogonal to the direction in which the SAW filters 14a and 14b are aligned. Thus, as in the case of the first embodiment, the parasitic capacitances and the parasitic inductances coupled to the balanced output terminals 18a and 18b can be equalized in the arrangement in which the second SAW resonators 46a and 46b are provided between the SAW filters 14a and 14b and the balanced output terminals 18a and 18b and are connected in series to the SAW filters 14a and 14b. Thus, the third embodiment is capable of improving the amplitude balance and the phase balance that depend on the frequency and the bandpass characteristic. Particularly, increased attenuation resulting from the amplitude balance with respect to the frequency can be realized at frequencies outside of the pass band.

When the anti-resonance frequencies of the second SAW resonators 46a and 46b are set at frequencies close to the pass band and outside thereof, it is possible to form an attenuation pole close to and outside of the pass band. It is thus possible to increase the attenuation outside of the pass band without increasing the insertion loss.

Further, the balance filter 10 of the third embodiment can be miniaturized because only one ground terminal 26 is employed like the first embodiment.

Fourth Embodiment

Figure 10:
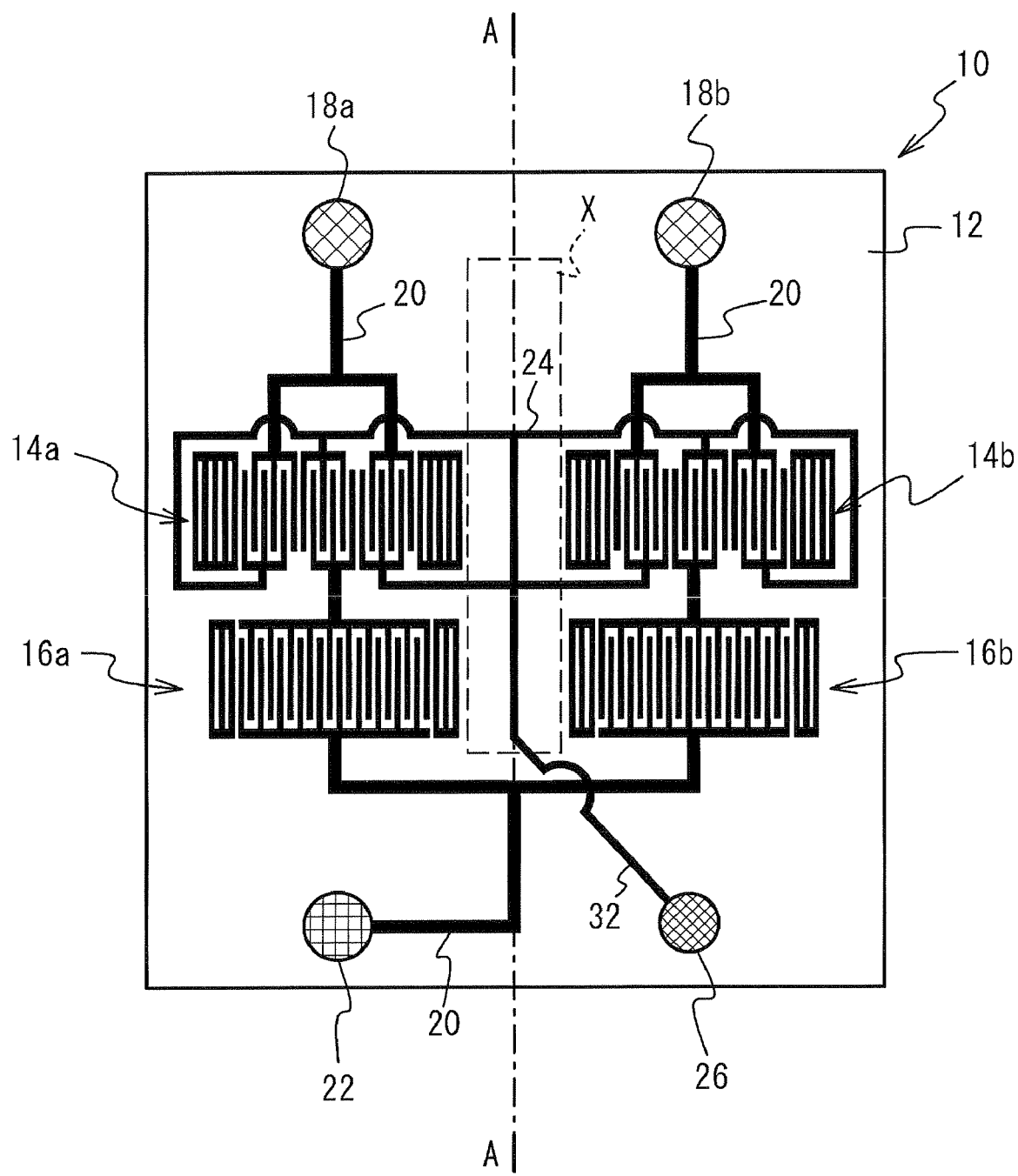
FIG. 10 is a schematic plan view of a balance filter in accordance with a fourth embodiment.

FIG. 10 is a schematic plan view of a balance filter in accordance with a fourth embodiment of the present invention. Referring to FIG. 10, the first SAW resonator 16a is located between the SAW filter 14a and the unbalanced input terminal 22 and is connected in series to the SAW filter 14a. The first SAW resonator 16b is located between the SAW filter 14b and the unbalanced input terminal 22 and is connected in series to the SAW filter 14b. The other structures of the fourth embodiment are the same as those of the first embodiment illustrated in FIG. 2.

According to the fourth embodiment, like the first embodiment, the first interconnection portion 24 and the second interconnection portion 32 are connected to each other in the region X that is located between the SAW filters 14a and 14b and extends in the direction orthogonal to the direction in which the SAW filters 14a and 14b are aligned. Thus, as in the case of the first embodiment, the parasitic capacitances and the parasitic inductances coupled to the balanced output terminals 18a and 18b can be equalized in the arrangement in which the second SAW resonators 16a and 16b are provided between the SAW filters 14a and 14b and the balanced output terminals 18a and 18b and are connected in series to the SAW filters 14a and 14b. Thus, the fourth embodiment is capable of improving the amplitude balance and the phase balance that depend on the frequency and the bandpass characteristic. Particularly, increased attenuation resulting from the amplitude balance with respect to the frequency can be realized at frequencies outside of the pass band.

When the anti-resonance frequencies of the first SAW resonators 16a and 16b are set at frequencies close to the pass band and outside thereof, it is possible to form the attenuation pole close to and outside of the pass band. It is thus possible to increase the attenuation outside of the pass band without increasing the insertion loss.

Further, the balance filter 10 of the fourth embodiment can be miniaturized because only one ground terminal 26 is provided like the first embodiment.

Fifth Embodiment

Figure 11:
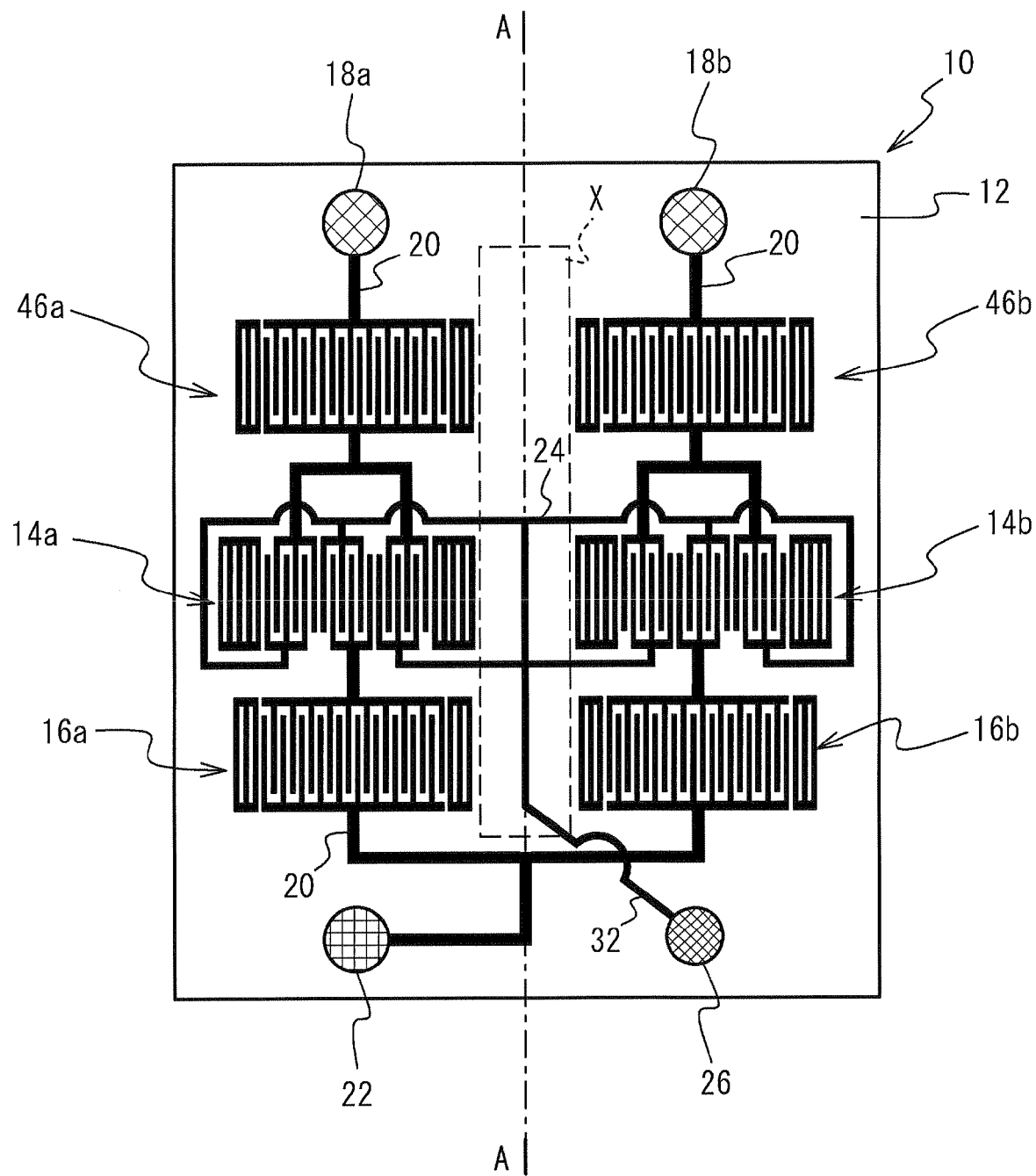
FIG. 11 is a schematic plan view of a balance filter in accordance with a fifth embodiment.

FIG. 11 is a plan view of a balance filter in accordance with a fifth embodiment of the present invention. Referring to FIG. 11, the second SAW resonator 46a is provided between the SAW filter 14a and the balanced output terminal 18a and is connected in series to the SAW filter 14a. Similarly, the second SAW resonator 46b is provided between the SAW filter 14b and the balanced output terminal 18b and is connected in series to the SAW filter 14b. The first SAW resonator 16a is provided between the SAW filter 14a and the unbalanced input terminal 22 and is connected in series to the SAW filter 14a. Similarly, the first SAW resonator 16b is provided between the SAW filter 14b and the unbalanced input terminal 22 and is connected in series to the SAW filter 14b. The other structures of the fifth embodiment are the same as those of the first embodiment illustrated in FIG. 2.

In the fifth embodiment, like the first embodiment, the first interconnection portion 24 and the second interconnection portion 32 are connected to each other in the region X that is located between the SAW filters 14a and 14b and extends in the direction orthogonal to the direction in which the SAW filters 14a and 14b are aligned. The second SAW resonators 46a and 46b connected in series to the SAW filters 14a and 14b are provided between the SAW filters 14a and 14b and the balanced output terminals 18a and 18b. The fifth embodiment is capable of improving the amplitude balance and the phase balance that depend on the frequency and the bandpass characteristic. Particularly, increased attenuation resulting from the amplitude balance with respect to the frequency can be realized at frequencies outside of the pass band.

When the anti-resonance frequencies of the second SAW resonators 46a and 46b and the first SAW resonators 16a and 16b are set at frequencies close to the pass band and outside thereof, it is possible to form the attenuation pole close to and outside of the pass band. It is thus possible to increase the attenuation outside of the pass band without increasing the insertion loss.

Further, the balance filter 10 of the fifth embodiment can be miniaturized because only one ground terminal 26 is provided like the first embodiment.

The first through fifth embodiments employs the double-mode SAW filters for the SAW filters 14a and 14b. However, the present invention is not limited to the double-mode filters but may use multi-mode filters in which multiple groups 28 of IDTs are aligned in the direction of SAW propagation. The SAW filters 14a and 14b may be replaced by boundary acoustic wave filters or other types of acoustic wave filters. These variations are capable of improving the amplitude balance and the phase balance that depend on the frequency and the bandpass characteristic, as in the case of the above-mentioned embodiments. The present invention includes a variation in which the input terminals are balanced terminals and the output terminal is an unbalanced terminal.

The present invention is not limited to the specifically disclosed embodiments, but include other embodiments and variations without departing from the scope of the present invention.

What is claimed is:

1. A balance filter comprising:
   two acoustic wave filters connected between a single unbalanced terminal and two balanced terminals;
   a single ground terminal connected to the two acoustic wave filters via a first interconnection portion and a second interconnection portion and arranged at a same side where the single unbalanced terminal is provided with respect to the two acoustic wave filters, the first interconnection portion connected to the two acoustic wave filters, and
   the second interconnection portion connected to the first interconnection portion in a region that is located between the two acoustic wave filters and extends in a direction orthogonal to a direction in which the two acoustic wave filters are aligned.

2. The balance filter according to claim 1, wherein the first interconnection portion is symmetrical about a line between the two acoustic wave filters.

3. The balance filter according to claim 1, wherein the two balanced terminals are symmetrical about a line between the two acoustic wave filters.

4. The balance filter according to claim 1, further comprising a first resonator that is provided between the two acoustic wave filters and the unbalanced terminal and is connected in series to the two acoustic wave filters.

5. The balance filter according to claim 1, further comprising a first resonator that is provided between one of the two acoustic wave filters and the unbalanced terminal and is connected in series to said one of the two acoustic wave filters and another first resonator that is provided between the other acoustic wave filter and the unbalanced terminal and is connected in series to the other acoustic wave filter.

6. The balance filter according to claim 1, further comprising a second resonator that is provided between one of the two acoustic wave filters and one of the two balanced terminals and is connected in series to said one of the two acoustic wave filters, and another second resonator that is provided between the other acoustic wave filter and the other balanced terminal and is connected in series to the other acoustic wave filter.

7. The balance filter according to claim 1, wherein:
   the two acoustic wave filters are multi-mode filters;
   the first interconnection portion has portions connected to the two acoustic wave filters on both sides of each of the two acoustic wave filters; and
   the portions of the first interconnection portion are connected to each other between the two acoustic wave filters.

8. The balance filter according to claim 1, further comprising:
   a third interconnection portion that connects the two acoustic wave filters to the single unbalanced terminal and the two balanced terminals;
   a piezoelectric substrate on which the two acoustic wave filters, the second interconnection portion and the third interconnection portion are formed; and
   a bump that is used for flip-chip mounting and is provided on the second interconnection portion and the third interconnection portion.

9. The balance filter according to claim 1, further comprising a third interconnection portion that connects the two acoustic wave filters to the two balanced terminals; wherein:
   the two acoustic wave filters are multi-mode filters and have multiple interdigital transducers;
   the third interconnection portion is connected to more than two interdigital transducers of the multiple interdigital transducers; and
   the first interconnection portion is arranged so as to surround the two acoustic wave filters and crosses the third interconnection portion that is connected to the more than two interdigital transducers.

* * * * *